US009449826B2

(12) United States Patent
Mulfinger et al.

(10) Patent No.: US 9,449,826 B2
(45) Date of Patent: Sep. 20, 2016

(54) GRADED WELL IMPLANTATION FOR ASYMMETRIC TRANSISTORS HAVING REDUCED GATE ELECTRODE PITCHES (75) Inventors: G Robert Mulfinger, Dresden (DE); Andy Wei, Dresden (DE); Jan Hoentschel, Dresden (DE); Vassilios Papageorgiou, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 1592 days.

(21) Appl. No.: 12/692,886

(22) Filed: Jan. 25, 2010

(65) Prior Publication Data
US 2010/0193866 A1 Aug. 5, 2010

(30) Foreign Application Priority Data

Jan. 30, 2009 (DE) .................. 10 2009 006 885

(51) Int. Cl.
| H01L 21/8234 | (2006.01) |
| H01L 21/336 | (2006.01) |
| H01L 21/266 | (2006.01) |
| H01L 21/265 | (2006.01) |
| H01L 29/66 | (2006.01) |
| H01L 29/78 | (2006.01) |

(52) U.S. Cl.
CPC ......... *H01L 21/266* (2013.01); *H01L 21/2652* (2013.01); *H01L 21/26586* (2013.01); *H01L 21/823493* (2013.01); *H01L 29/6659* (2013.01); *H01L 29/7833* (2013.01)

(58) Field of Classification Search
CPC .............. H01L 21/266; H01L 21/823493; H01L 29/7833; H01L 21/26586; H01L 21/2652; H01L 29/6659
See application file for complete search history.

(56) References Cited

U.S. PATENT DOCUMENTS

| 3,769,109 A | 10/1973 | MacRae et al. ................... 156/3 |
| 5,111,240 A | 5/1992 | Boettiger et al. |
| 5,371,394 A | 12/1994 | Ma et al. ....................... 257/335 |
| 5,798,552 A | 8/1998 | Alavi et al. .................... 257/371 |
| 6,015,991 A | 1/2000 | Wheeler et al. ............... 257/336 |
| 6,096,610 A | 8/2000 | Alavi et al. |
| 6,507,058 B1 | 1/2003 | Hall et al. ..................... 257/285 |

(Continued)

FOREIGN PATENT DOCUMENTS

| EP | 0 209 166 A1 | 5/1986 | ............. H01L 29/10 |
| EP | 0731387 A2 | 9/1996 | |

(Continued)

OTHER PUBLICATIONS

PCT International Search Report from PCT/EP2010/000491 dated May 7, 2010.

(Continued)

*Primary Examiner* — Jarrett Stark (57) ABSTRACT

In sophisticated semiconductor devices, an asymmetric transistor configuration may be obtained on the basis of an asymmetric well implantation while avoiding a tilted implantation process. For this purpose, a graded implantation mask may be formed, such as a graded resist mask, which may have a higher ion blocking capability at the drain side compared to the source side of the asymmetric transistor. For instance, the asymmetric configuration may be obtained on the basis of a non-tilted implantation process with a high degree of performance gain and may be accomplished irrespective of the technology standard under consideration.

15 Claims, 7 Drawing Sheets (56) References Cited

U.S. PATENT DOCUMENTS

| | | | |
|---|---|---|---|
| 6,518,136 B2* | 2/2003 | Lee et al. | 438/303 |
| 6,624,030 B2* | 9/2003 | Chang et al. | 438/268 |
| 7,144,797 B2* | 12/2006 | Chow et al. | 438/549 |
| 7,485,892 B2* | 2/2009 | Ooi et al. | 257/14 |
| 2001/0000159 A1 | 4/2001 | Muller | |
| 2002/0003918 A1* | 1/2002 | Ooi et al. | 385/14 |
| 2006/0040450 A1 | 2/2006 | Hsu | |
| 2006/0068571 A1* | 3/2006 | Chow et al. | 438/514 |
| 2006/0194381 A1 | 8/2006 | Wei et al. | 438/197 |
| 2008/0067585 A1* | 3/2008 | Williams et al. | 257/330 |

FOREIGN PATENT DOCUMENTS

| | | | |
|---|---|---|---|
| JP | 60227474 A | 11/1985 |
| JP | 07130681 A | 5/1995 |
| JP | 08153803 A | 6/1996 |
| JP | 11274491 A | 10/1999 |
| JP | 11340174 A | 12/1999 |
| JP | 2001044409 A | 2/2001 |
| WO | 2005017993 A1 | 2/2005 |

OTHER PUBLICATIONS

PCT International Preliminary Report on Patentability and Written Opinion from PCT/EP2010/000491 dated Aug. 2, 2011.

Translation of Official Communication from German Patent Office for German Patent Application No. 10 2009 006 885.6 dated Mar. 23, 2010.

* cited by examiner

GRADED WELL IMPLANTATION FOR ASYMMETRIC TRANSISTORS HAVING REDUCED GATE ELECTRODE PITCHES

BACKGROUND OF THE INVENTION

1. Field of the Invention

The present disclosure generally relates to the fabrication of integrated circuits, and, more particularly, to the asymmetric field effect transistor elements and respective tilted implantation techniques so as to enhance transistor performance.

2. Description of the Related Art

Integrated circuits typically include a large number of individual circuit elements, such as transistors, capacitors, resistors and the like. These individual circuit elements are electrically connected according to the desired circuit layout by respective conductive lines, which are mainly formed in separate "wiring" layers that are typically referred to as metallization layers. For enhancing performance of the integrated circuit, usually the number of individual circuit elements is increased, thereby obtaining a more complex functionality of the circuit, which in turn requires reducing the feature sizes of the individual circuit elements. Generally, a plurality of process technologies are currently practiced, wherein, for logic circuitry, such as microprocessors, storage chips and the like, CMOS technology is presently the most promising approach due to the superior characteristics in view of operating speed and/or manufacturing costs and/or power consumption. During the fabrication of complex integrated circuits using CMOS technology, millions of complementary transistors, i.e., N-channel transistors and P-channel transistors, are formed in and on an appropriate crystalline semiconductor material, wherein currently the vast majority of logic circuitry is fabricated on the basis of silicon. Typically, a MOS transistor, irrespective of whether an N-channel transistor or a P-channel transistor is considered, comprises so-called PN junctions that are formed at an interface of highly doped drain and source regions with a channel region disposed between the drain region and the source region, wherein the channel region is at least partially inversely doped with respect to the drain and source regions. The conductivity of the channel region, which represents an essential device criterion, as the reduced current drive capability of scaled devices has to be, at least partially, compensated for by an increased conductivity, is controlled by a gate electrode formed above the channel region and separated therefrom by a thin insulating layer. The conductivity of the channel region depends on the dopant concentration, the mobility of the charge carriers and, for a given dimension of the channel region in the transistor width direction, the distance between the source and drain regions, which is also referred to as channel length. In addition to the channel conductivity, the transistor performance is also significantly influenced by the capability of rapidly creating a conductive channel in the channel region upon application of a specified control voltage to the gate electrode, since usually the transistors are operated in a switched mode requiring a fast transition from the transistor on-state to the transistor off-state and vice versa. Moreover, other aspects also have to be taken into consideration when designing a transistor of high performance circuits. For instance, static and dynamic leakage currents may significantly affect the overall performance of an integrated circuit, as the achievable amount of heat dissipation that is required for transistor architectures producing high dynamic and/or static leakage currents, may restrict the maximum practical operating frequency. In other cases, the controllability of the channel region may be degraded in devices with very short channel lengths, thereby requiring sophisticated dopant profiles in the drain and source regions.

Figure 1A:
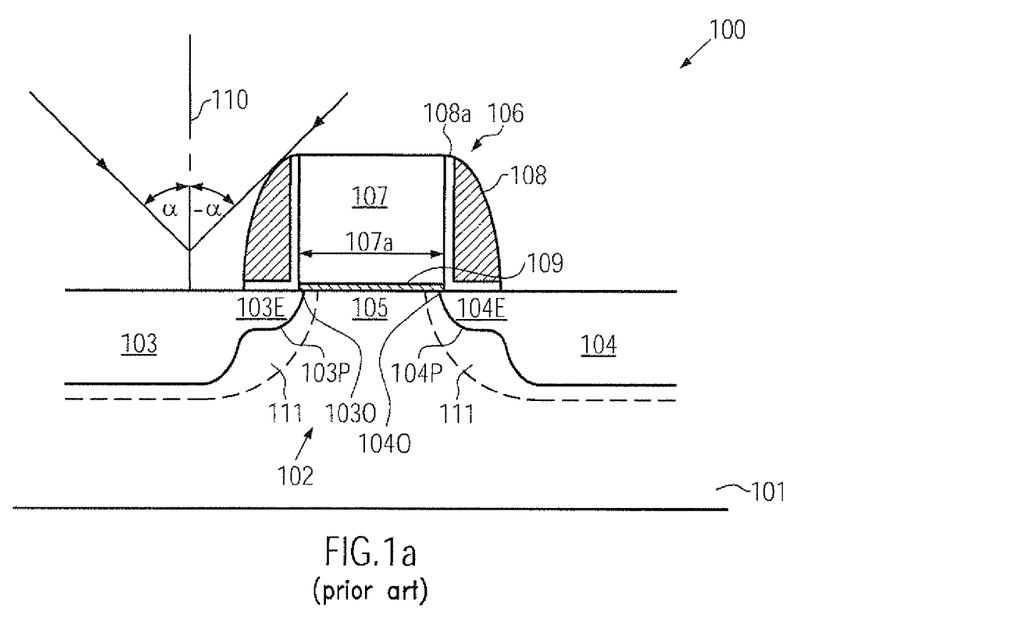
FIG. 1a schematically illustrates a cross-sectional view of a typical conventional architecture of a field effect transistor with a complex dopant profile formed by tilted halo implantations.
Figure 1B:
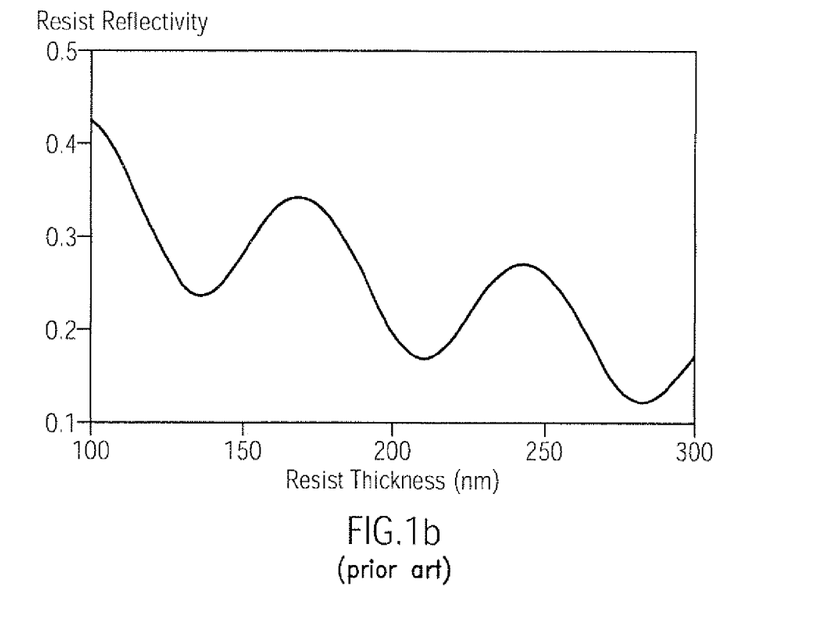
FIG. 1b schematically illustrates a swing curve of a resist material.
Figure 1C:
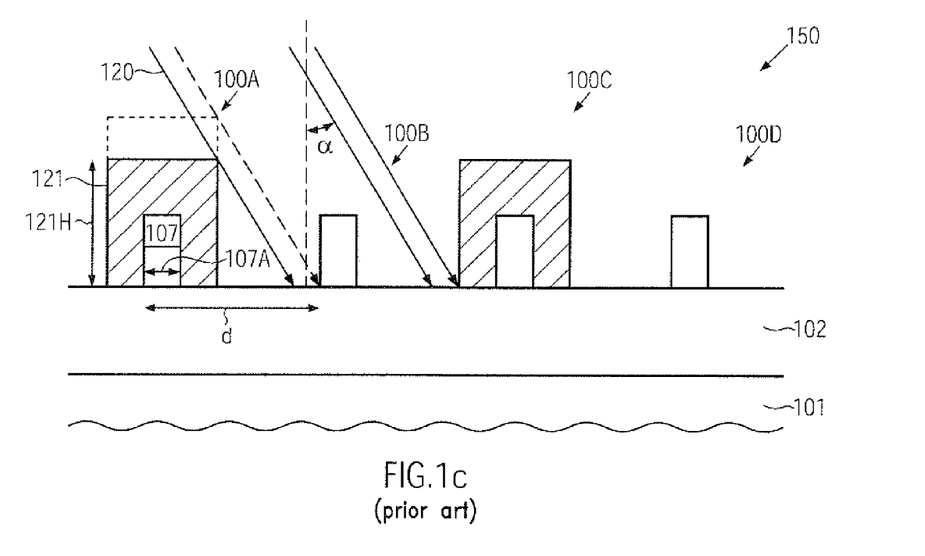
FIG. 1c schematically illustrates a cross-sectional view of a semiconductor device including a plurality of extremely scaled transistor elements during a tilted implantation process and corresponding implantation masks requiring a compromise between resist thickness and tilt angle, according to conventional strategies.

With reference to FIGS. 1a-1c, a typical transistor architecture of a field effect transistor element will now be described in more detail in order to more clearly explain some of the problems encountered in currently used transistor designs. In FIG. 1a, a transistor element 100 comprises a substrate 101, which may represent a bulk semiconductor substrate such as a silicon substrate, or any other appropriate substrate having formed thereon a crystalline semiconductor layer, which may typically be formed on the basis of silicon for logic circuitry. Thus, the substrate 101 is to be considered as a substrate having formed thereon a substantially crystalline semiconductor region 102, in which are formed a drain region 104 including a so-called extension region 104E. Similarly, a source region 103 is formed in the crystalline region 102 and includes an extension region 103E. The area disposed between the extension regions 103E and 104E is referred to as a channel region 105, since here typically a conductive channel is created during the on-state of the transistor 100, as will be described later on. Located above the channel region 105 is a gate electrode structure 106 that includes a gate electrode 107 and sidewall spacers 108. Moreover, a gate insulation layer 109 is provided between the gate electrode 107 and the semiconductor region 102 so as to electrically insulate the gate electrode 107 from any conductive regions within the crystalline semiconductor region 102. Regarding the design and material composition of the gate electrode structure 106, it is to be noted that, in principle, the gate electrode 107 may be considered as a conductive line, the "width" dimension of which is referred to as gate length 107a, whereas the "length" of the line, extending in a direction perpendicular to the drawing plane, is referred to as the gate width (not shown in FIG. 1a). The gate electrode 107 may be comprised of any appropriate material and is typically formed in advanced silicon based integrated circuits of heavily doped polysilicon in combination with a highly conductive metal silicide, such as nickel silicide, cobalt silicide and the like. However, depending on the process strategy and the design criteria, other materials, such as metals, may be used. The gate insulation layer 109 may be comprised of any appropriate insulating material, such as silicon dioxide, silicon nitride and/or high-k materials, to provide a required electrical insulation while maintaining a high capacitive coupling to the channel region 105. Hence, for well-approved silicon dioxide based gate insulation layers, a thickness of the gate insulation layer 109 is on the order of a few nanometers, for example 2 nm and less, thereby causing moderately high static leakage currents, which may amount to approximately 30% or even more of the overall electrical losses of advanced transistor elements.

During the manufacturing process, the substrate 101 is treated so as to form the semiconductor region 102 with high crystalline quality which may be achieved by epitaxial growth and the like. Thereafter, photolithography, etch and deposition processes may be performed to define the dimensions of the semiconductor region 102 by providing appropriate isolation structures (not shown). Thereafter, implantation sequences may be carried out so as to position one or more dopants within the crystalline semiconductor region 102 to thereby form a specified vertical dopant profile (not shown) within the region 102, which may finally result in a specified vertical dopant profile in the channel region 105. Next, material layers for the gate insulation layer 109 and the gate electrode 107 may be formed, for instance, by advanced oxidation and/or deposition techniques for the gate insulation material and by advanced low pressure chemical vapor deposition (CVD) for a poly-crystalline silicon layer as a gate electrode material. Thereafter, highly sophisticated photolithography and etch techniques may be employed to pattern the gate electrode material and the gate insulation layer material to form the gate electrode 107 and the gate insulation layer 109 on the basis of the design gate length 107*a*. Thereafter, complex implantation cycles may be performed to create the drain and source regions 103, 104 and the corresponding extensions 103E, 104E, wherein the gate electrode 107, partially in combination with the sidewall spacers 108, acts as an implantation mask. For example, according to one strategy, a so-called pre-amorphization implantation may be carried out, during which a heavy ion species, such as xenon ions and the like, may be implanted into the crystalline semiconductor region 102 so as to substantially completely destroy the crystalline lattice to a specified depth, which may enhance performance of subsequent implantation and anneal processes. During the pre-amorphization implantation, the ion beam may be tilted with respect to a direction 110 perpendicular to the substrate 101 so as to also amorphize an area of the region 102 corresponding to the extension regions 103E, 104E. Thereafter, a so-called halo or counter-doping implantation may be performed in which an ion species is introduced that represents the same conductivity type as is already present in the channel region 105 to enhance the dopant concentration of this ion species within specific halo regions, which are indicated as 111. Similarly to the pre-amorphization implantation, the halo implantation may be performed with respective tilt angles, such as $\alpha$ and $-\alpha$ so as to form the halo regions 111 at the drain side and the source side. Subsequently, a further implantation may be performed with an ion species having the opposite conductivity type with respect to the halo implantation to form the source extension 103E and the drain extension 104E, wherein possibly an additional offset spacer (not shown) may be formed on sidewalls of the gate electrode 107 prior to the implantation. Thereafter, the sidewall spacer 108 may be formed and may be used in a subsequent implantation process as an implantation mask to form the deep and heavily doped drain and source regions 104, 103. Thereafter, the transistor element 100 may be annealed, thereby activating the dopants introduced by the preceding implantation sequences, i.e., initiating a diffusion so as to place the dopants at lattice sites while substantially re-crystallizing those portions of the region 102 that were damaged by the pre-amorphization and the subsequent implantation processes. During this anneal cycle, thermally induced diffusion of the dopants occurs in accordance with the respective concentration gradient of the dopant species under consideration, thereby substantially determining the finally obtained size and characteristics of the drain and source regions 104, 103 and the corresponding extension regions 104E, 103E, as well as the characteristics of PN junctions 103P and 104P defined as an interface area between the halo implantation region 111 and the respective drain or source region 104, 103. During the implantation cycles and/or during the subsequent anneal cycle, a certain amount of overlap, referred to as overlap regions 103O and 104O is created, which also significantly affects the transistor behavior. Thereafter, the manufacturing process may be continued with the formation of metal silicide regions in the drain and source regions 104, 103 and in the gate electrode 107 followed by the formation of an interlayer dielectric and respective contacts to the drain and source regions 104, 103 and the gate electrode 107. For convenience, these components are not shown in FIG. 1*a*.

During operation, typically, a supply voltage is applied to the drain region 104 and the source region 103, for example 1-5 volts for typical CPUs, while a corresponding control voltage is applied to the gate electrode 107 to define the conductivity state of the channel region 105. For the following discussion, the transistor 100 is considered to represent an N-channel enhancement type transistor in which the channel region 105 is P-doped and the drain and source regions 104, 103 and the corresponding extensions 104E, 103E are heavily N-doped. For a P-channel enhancement type transistor, the type of charge carriers involved and the conductivity type of the dopants may be inverted. Also, the following explanations in principle apply to depletion type transistors. Hence, upon application of a control voltage to the gate electrode 107 below a specific threshold voltage, which is determined, among other things, by the vertical dopant profile within the channel region 105, the transistor 100 is in the off-state, that is, the PN junction 104P is inversely biased and hence a current from the source region 103 through the channel region 105 to the drain region 104 is substantially suppressed. However, during the off-state, the high electrical field prevailing at the overlap 104O may lead to tunnel currents into the gate electrode 107, especially when the gate insulation layer 109 is moderately thin, as is the case in sophisticated transistor devices. These currents may be considered as static leakage currents. Moreover, the overlap region 104O, in combination with the overlying gate electrode 107 and the gate insulation layer 109, forms a capacitor, which has to be charged and discharged when operating the transistor 100 in a switched mode.

During application of a control voltage exceeding the threshold voltage, a conductive channel is formed in the channel region 105 originating from the source side extension region 103E and terminating at the drain side extension region 104E. For the building up of the conductive channel, in the present case created by electrons, the overlap region 103O, as well as the relatively steep concentration gradient of the PN junction 103P, created by the increased dopant concentration of the halo region 111, is advantageous in obtaining a high on-current. Contrary thereto, the steep concentration gradient at the PN junction 104P may lead to enhanced currents into the substrate 101, that is, in lower lying crystalline areas of the region 102, which may finally be drained off by a corresponding body contact, so that the dynamic leakage currents may also increase with an increase of the on-current. Moreover, during the building up of the conductive channel, the parasitic capacitances caused by the overlaps 104O, 103O may require high currents for recharging the parasitic capacitor and may delay the start of the on-state, thereby degrading the raise and fall times during the switching operation.

As can be seen from the above discussion, in addition to the overall geometric configuration of the transistor 100, such as transistor length and width, as well as material compositions, dopant concentrations and the like, the lateral and vertical dopant profiling within the semiconductor region 102 significantly affects the finally obtained transistor performance.

Due to the ongoing scaling of transistor elements, resulting in a continuously increased operation speed, tilted implantation processes may represent an important manufacturing strategy for obtaining the required complex dopant profiles. For example, as described above, the halo implantations may have to be performed with a specified tilt angle in order to precisely adjust the overall final dopant gradient at the PN junctions. Furthermore, as explained above, in sophisticated semiconductor devices, an asymmetric transistor configuration may be implemented, for instance, by selecting different overall dopant profiles at the drain side and source side to enhance overall drive current capability and channel controllability, for instance by increasing the overlap between the drain and source regions at one side, such as the source side, while reducing the overlap at the drain side, wherein the corresponding dopant gradients may also be appropriately adjusted. In other cases, an asymmetric configuration of drain and source regions may be accomplished by performing an asymmetric halo implantation, at least for specific transistor elements, depending on the overall device configuration. Consequently, during the complex manufacturing flow for defining the dopant profiles, a plurality of masking and implantation steps may have to be performed, in which transistor areas of one type of transistor may have to be protected, while other transistors have to be exposed to a tilted implantation step. However, for extremely scaled transistor devices, the distance between neighboring transistor elements may be in the range of several hundred nanometers and significantly less, while at the same time the height of the gate electrode structures may not be arbitrarily reduced in view of the ion blocking capability during the drain and source implantation processes so that, for reduced distances between neighboring transistor elements, a certain degree of shadowing during a tilted implantation process may occur. This situation may even become more serious when certain transistors in densely spaced device regions may have to be masked during a tilted implantation process, since the corresponding implantation mask may further contribute to an increased shadowing effect, which may even prevent the ion species to reach the active region, thereby significantly contributing to transistor performance degradation. On the other hand, the overall thickness of the resist material used for providing the implantation masks may not be arbitrarily reduced, as will be explained with reference to FIGS. 1b and 1c.

FIG. 1b illustrates a resist reflectivity versus a thickness of a typical resist material used in advanced photolithography techniques. As shown, a typical swing curve with several minima, for instance at approximately 280 nm and 210 nm, may be obtained. Since the overall performance of the lithography process may be influenced by the magnitude of reflectivity, in view of overall lithography performance, it would be preferable to use increased resist thickness, for instance at approximately 280 nm, in order to provide reduced reflectivity. On the other hand, an increased resist thickness may not be compatible with performance during tilted implantation processes.

FIG. 1c schematically illustrates the situation in sophisticated semiconductor devices. As illustrated, a semiconductor device 150 may comprise a plurality of transistors 100A, 100B, 100C, 100D at an early manufacturing stage. The transistors 100A, 100B, 100C, 100D may have substantially the same configuration as previously described, wherein, however, the gate length 107A may be approximately 50 nm and less. Furthermore, the semiconductor device 150 is shown at a tilted implantation process 120, which may represent a tilted halo implantation and/or a tilted implantation process for defining drain and source extension regions, as previously explained. As discussed above, during the tilted implantation process 120, some of the transistors 100A, 100B, 100C, 100D may have to be protected, such as the transistors 100A and 100C, for instance, these transistors may represent transistors of different conductivity type or the basis dopant profile has to be adjusted differently compared to the non-masked transistors 100B, 100D. For this purpose, an implantation mask 121, that is, a resist mask, is provided to cover the transistors 100A, 100C. For a given distance, indicated as d, that depends on the overall design rules for the device 150, and for a given tilt angle α, which may range between 20 and 30 degrees, the height of the resist mask 121, indicated as 121H, may result in a certain degree of shadowing of the active region of the transistors 100B, 100D, as is indicated by the dashed lines. Consequently, an increased resist thickness, which may be desirable in view of enhancing the overall lithography performance due to a reduced reflectivity, may not be compatible with the resulting shadowing effect. On the other hand, a certain minimum resist thickness may be required to provide a sufficient lithography performance, for instance, with respect to defining critical dimensions of the resist mask 121 and the like. For example, maintaining a reduced resist thickness above the gate electrode structures 107 may result in a significant difference in the photochemical behavior of the resist material formed above the gate electrodes 107 and above other device regions without gate electrodes. For example, the photochemical reaction may proceed with significantly increased speed above the gate electrode structures 107, thereby causing a reduced line thickness of the masks 121 or the transistors 100A, 100C, which in turn may result in a reduced blocking effect during the tilted implantation process 120. As previously discussed, a significant reduction of the height of the gate electrodes 107 may not be a viable option since the ion blocking effect of the gate electrode 107 may have to be adapted to the requirements of an implantation process for defining the deep drain and source areas in a later manufacturing stage. Consequently, the height of the gate electrodes 107 may not be reduced in proportion to a reduction of the distance d during a further device scaling. On the other hand, reducing the tilt angle α may result in a significant degradation of performance of the transistors 100A, 100B, 100C, 100D. Consequently, for a given device geometry, that is, the distance d and the gate height, conventionally a compromise between the height 121H of the resist masks 121 and the tilt angle α is to be used, thereby causing a significantly less pronounced performance gain as would be desired for the technology standard under consideration.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to semiconductor devices and techniques for forming an asymmetric transistor configuration on the basis of a process technique that enables a high degree of scalability with respect to any advances in semiconductor manufacturing techniques that may require further reduced critical dimensions of the corresponding transistor elements. To this end, an asymmetric well dopant profile may be created in the source and drain areas of asymmetric transistors by using an appropriately designed implantation mask having a different ion blocking capability for the drain and source areas. Consequently, sophisticated tilted implantation processes, which may typically require a certain compromise between tilt angle and thickness of the implantation mask, may be avoided, thereby increasing gain in performance of asymmetric transistor configurations for highly sophisticated transistor elements including devices with critical dimensions of approximately 50 nm and less. Moreover, the desired asymmetric configuration of high performance transistors may be accomplished on the basis of well-established circuit layouts, i.e., on the basis of circuit layouts in which symmetric and asymmetric transistors may be provided in close proximity to each other, substantially without being constrained by gate height and gate pitch of neighboring transistors as is typically the case for conventional strategies using a tilted implantation sequence for increasing the counter doping in the source areas of asymmetric transistors. In some illustrative aspects disclosed herein, the implantation mask providing the different ion blocking capabilities may be formed in an early manufacturing stage on the basis of a superior device topography so that a corresponding mask configuration, such as a graded mask profile, may be provided on the basis of lithography techniques, etch techniques and the like.

One illustrative method disclosed herein comprises forming an implantation mask above a semiconductor region, wherein the implantation mask has a first ion blocking capability above a first transistor internal area of a transistor and having a second ion blocking capability above a second transistor internal area of the transistor, and wherein the first and second ion blocking capabilities differ from each other. Moreover, the method comprises implanting a well dopant species into the first and second transistor internal areas on the basis of the implantation mask. Finally, the method comprises forming a gate electrode above a channel area of the semiconductor region, wherein the channel area laterally separates the first and second transistor internal areas.

A further illustrative method disclosed herein comprises forming a graded implantation mask above a first transistor internal area and a second internal area of a transistor, wherein the graded implantation mask provides a first ion blocking capability for the first transistor internal area and a second increased ion blocking capability for the second transistor internal area. The method additionally comprises introducing a well dopant species in the first and second transistor internal areas on the basis of the implantation mask. Moreover, the method comprises forming drain and source regions on the basis of the first and second transistor internal areas so as to obtain an asymmetric transistor configuration.

One illustrative semiconductor device disclosed herein comprises a gate electrode structure formed above a channel region. Moreover, a drain region and a source region are formed in a well region and are laterally separated by the channel region. Additionally, a dopant concentration of a well dopant species gradually increases in a lateral direction from the channel region to a periphery of the transistor at least at a source side of the transistor.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present disclosure provides techniques and semiconductor devices in which an asymmetric transistor configuration may be provided with a high degree of independence with respect to the overall device dimension, such as the length of gate electrodes and the pitch between adjacent symmetric and asymmetric transistor elements. For this purpose, an asymmetry may be introduced by providing an asymmetric well dopant concentration, which may thus have a similar effect compared to conventional asymmetric halo or counter doping implantation processes wherein, however, the asymmetric well dopant profile may be established without requiring sophisticated tilted implantation techniques. For this purpose, an appropriate implantation mask may be applied which results in different ion blocking capabilities during a substantially non-tilted sequence for defining the well configuration of the transistor elements. For instance, a different thickness of the implantation mask may provide a different degree of ion blocking capability above the source area compared to the drain area, thereby enabling, in combination with a corresponding additional non-masked well dopant process, if required, the desired basic doping of P-channel transistors and N-channel transistors. For instance, based on a reduced ion blocking capability above the source side of a transistor, an increased concentration and thus overall increased amount of well dopant species may be incorporated, thereby generating increased field strength in combination with corresponding drain and source implantation dopant profiles. Since the asymmetric configuration of the basic well dopant concentration may be accomplished without requiring sophisticated tilted implantation sequences, at least for introducing the well dopant species, extremely delicate adaptations of resist thickness in view of gate height and gate pitch in sophisticated semiconductor devices may be avoided, thereby providing enhanced overall process flexibility and also obtaining scalability of the asymmetric transistor configurations disclosed herein. Consequently, complex redesigns of basic circuit layouts may not be necessary, which may conventionally have to be contemplated in order to obtain a high performance gain based on the asymmetric transistor configuration when symmetric and asymmetric transistors may have to be provided in close proximity to each other.

As a consequence, superior design flexibility may be combined with enhanced transistor performance of an asymmetric transistor irrespective of the technology standard under consideration by using the principles disclosed herein. With reference to FIGS. 2a-2j, further illustrative embodiments will now be described in more detail, wherein reference may also be made to FIGS. 1a-1c, if required.

Figure 2A:
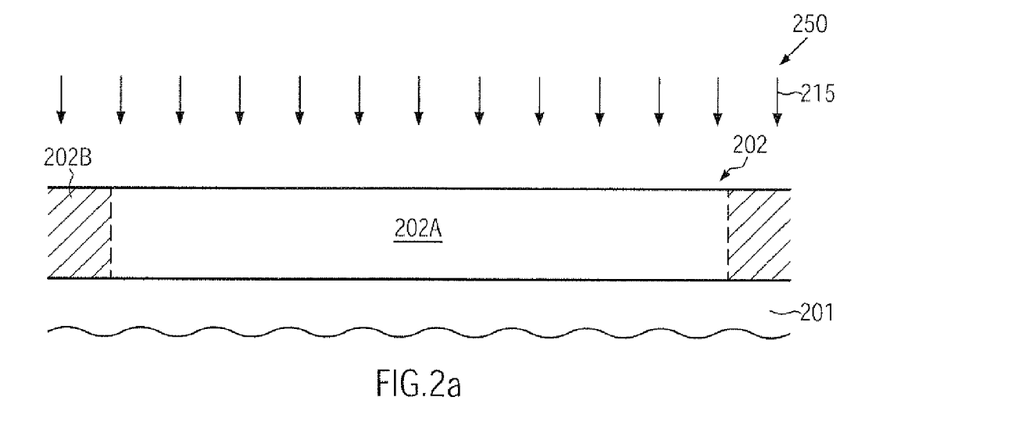
FIGS. 2a-2b schematically illustrate a cross-sectional view and a top view, respectively, of a semiconductor device at an early manufacturing stage during a process sequence for defining a well dopant concentration in an active semiconductor region, according to illustrative embodiments.

FIG. 2a schematically illustrates a cross-sectional view of a semiconductor device 250, which may comprise a substrate 201 and a semiconductor layer 202. The substrate 201 may represent any appropriate carrier material for forming thereabove the semiconductor layer 202. For example, the substrate 201 may represent a semiconductor substrate, an insulating substrate and the like. The semiconductor layer 202 may represent a silicon-based material, that is, a material including a significant portion of silicon, wherein other components, such as germanium, carbon and the like, may also be incorporated in order to establish the overall electronic characteristics required for the device 250. It should be appreciated, however, that the semiconductor layer 202 may be comprised of any other appropriate semiconductor material, depending on the overall device requirements. Furthermore, in some cases, the semiconductor layer 202 in combination with the substrate 201 may form a silicon-on-insulator (SOI) configuration, wherein a buried insulating layer (not shown) may be positioned between the substrate 201 and the semiconductor layer 202. In other cases, the semiconductor layer 202 may represent a part of a substantially crystalline semiconductor material of the substrate 201, thereby defining a "bulk" configuration. In some illustrative embodiments, an isolation structure 202B may be formed in the semiconductor layer 202 and may extend to a specific depth, thereby defining or delineating an active region 202A, which is to be understood as a semiconductor region in which appropriate dopant profiles are to be established so as to form drain and source regions for one or more transistor elements. The isolation structures 202B may, for instance, be provided in the form of a shallow trench isolation, which may extend down to a buried insulating layer, if provided. For this purpose, any appropriate dielectric material, such as silicon dioxide, silicon nitride and the like, may be used in accordance with well-established device configurations. In other illustrative embodiments (not shown in FIG. 2a), the isolation structures 202B may still have to be formed in the semiconductor layer 202.

The semiconductor device 250 as illustrated in FIG. 2a may be formed on the basis of appropriate manufacturing techniques and design strategies in order to appropriately define a size and shape of the active region 202A in accordance with overall device requirements. For instance, as previously explained, the active region 202A may be selected so as to accommodate symmetric and asymmetric transistors in close proximity to each other, as is also discussed above with reference to the semiconductor device 150 of FIG. 1c. Moreover, if the isolation structures 202B are to be provided in the manufacturing stage as illustrated in FIG. 2a, corresponding techniques including photolithography, etch, deposition and planarization processes may be performed by using well-established device techniques. Thereafter, in some illustrative embodiments, an implantation process 215 may be performed in order to introduce desired well dopant species into the active region 202A at a desired concentration to establish, in combination with a further implantation sequence based on a specifically designed implantation mask, at least locally within the region 202A, an asymmetric doping. It should be appreciated that, in other illustrative embodiments, the implantation process 215 may be performed in a later manufacturing stage, for instance after introducing an asymmetric dopant concentration, at least in a desired area of the active region 202A. The implantation process 215 may be performed on the basis of appropriately selected parameters, such as dose and energy for a given well dopant species, while other active regions requiring a different type of dopant species may be covered by a resist mask. Thereafter, the region 202A may be covered by a resist mask and other active regions may be exposed to an appropriate ion bombardment for introducing the required well dopant species therein.

Figure 2B:
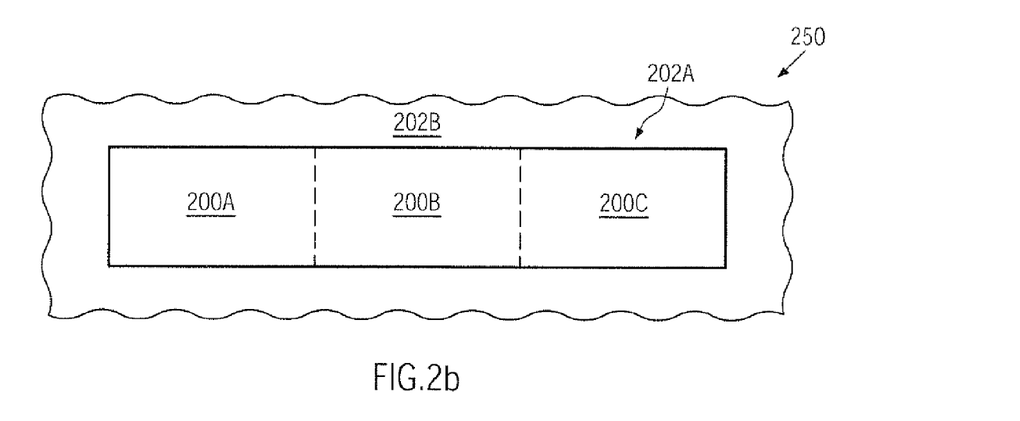

FIG. 2b schematically illustrates a top view of the semiconductor device 250, wherein the isolation structure 202B, if already provided, may laterally enclose the active region 202A, which may be dimensioned to accommodate at least one symmetric transistor device 200A and one asymmetric transistor device 200B positioned adjacent to each other. In the embodiment shown, a further transistor 200C may have to be formed in the active region 202A, which may also represent a symmetric transistor so that the asymmetric device 200B may be positioned between the two symmetric transistors 200A, 200C, which may conventionally result in a significantly reduced performance gain when establishing an asymmetric transistor configuration on the basis of a tilted implantation process using a corresponding resist mask, as previously explained with reference to FIG. 1c.

Figure 2C:
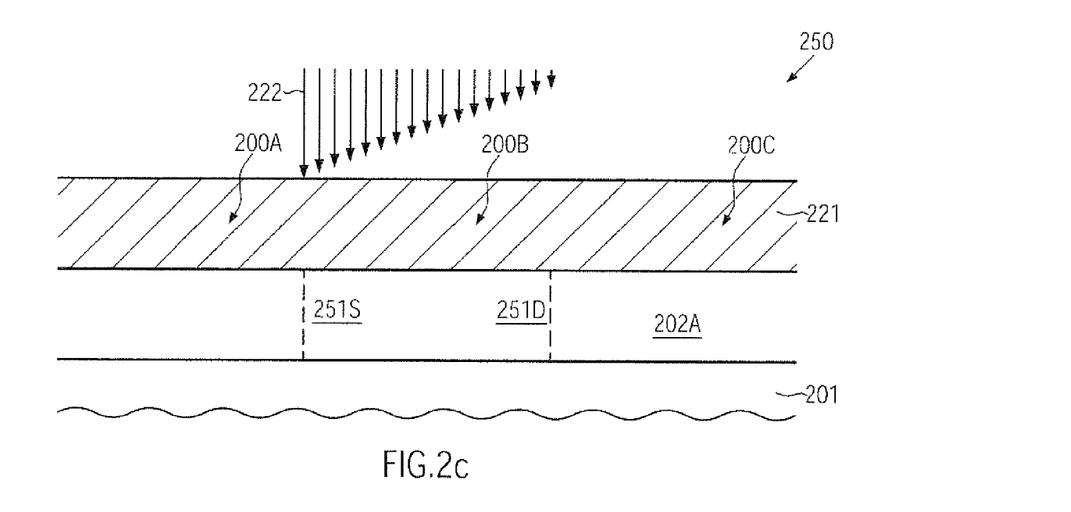
FIG. 2c schematically illustrates the semiconductor device in a further advanced manufacturing stage in which a resist material may be exposed so as to obtain a graded latent image, according to illustrative embodiments.

FIG. 2c schematically illustrates the semiconductor device 250 in a further advanced manufacturing stage in which a mask material 221 may be formed above the active region 202A, thereby covering the respective portions of the region 202A that may correspond to the transistors 200A, 200B, 200C still to be formed. In one illustrative embodiment, the mask material 221 may be provided in the form of a radiation sensitive material, such as photoresist and the like, with an appropriate thickness to provide the desired basic ion blocking capability with respect to an implantation process to be performed in a later manufacturing stage in order to introduce a well dopant species into the portion of the active region 202A corresponding to the transistor 200B in an asymmetric manner. For this purpose, in one illustrative embodiment, the device 250 may be subjected to an exposure process 222 in which the amount of radiation energy deposited in the mask material 221 above the active region of the transistor 200B may vary in a lateral direction, i.e., in FIG. 2c, along the horizontal direction, so as to result in a varying degree of exposure of the corresponding resist material, thereby resulting in a varying degree of photochemical reaction in the mask material 221. For instance, as illustrated, a substantially gradual lateral variation may be accomplished during the exposure process 222 within the active region of the device 200B so that the accumulated exposure dose in the resist material 221 positioned above a first transistor internal area 251S of the transistor 200B may be greater compared to the accumulated exposure dose of the material 221 positioned above a second device internal area 251D. As is well known, during lithography processes, a lithography mask (not shown) may typically be used to define exposed and non-exposed areas in a photoresist material, wherein the exposed or the non-exposed material portions may be removed, depending on the type of resist material used, i.e., positive resist or negative resist. Thus, for the exposure 222 of the device 250, an appropriately designed lithography mask may be used in which areas corresponding to the transistors 200A, 200C may remain substantially non-exposed for a positive resist material in the layer 221, while appropriate mask features in the lithography mask may be provided to obtain a different degree of exposure for the areas 251S, 251D of the transistor 200B. For this purpose, one or more semi-transparent mask features may be provided and/or a grating may be defined in the lithography mask so as to finally obtain a desired variation of the exposure dose deposited within the material 221 during the exposure 222 on the basis of otherwise predefined exposure parameters. For instance, the exposure parameters in combination with other process parameters of pre-exposure and post-exposure treatments including the development process for removing exposed portions of the material 221 may be selected such that a substantially complete removal of material of the layer 221 may be accomplished at the outermost periphery of the region 251S, while the degree of material removal may gradually decrease towards the transistor internal area 251D, which may result in substantially no material removal at the interface between the area 251D and the portion of the active region 202A corresponding to the transistor 200C.

It should be appreciated that, in the embodiment shown in FIG. 2c, the exposure process 222 may be performed on the basis of a superior overall device topography since any other device features may not yet be formed, which may cause a more or less pronounced surface topography. For instance, in one illustrative embodiment, the isolation structure 202B (FIG. 2b) may be formed in a later manufacturing stage when even a subtle variation of surface topography caused by the isolation structure 202B may be considered inappropriate.

Figure 2D:
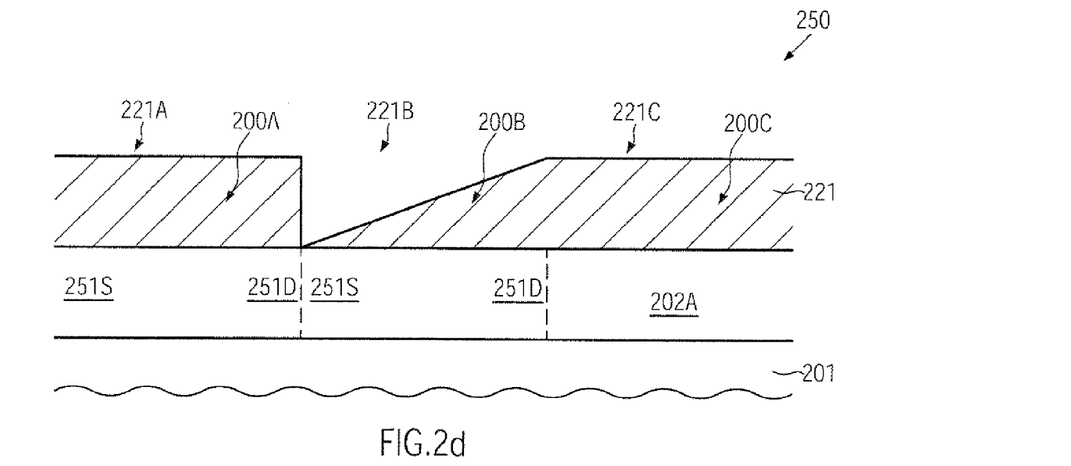
FIGS. 2d-2e schematically illustrate cross-sectional views of the semiconductor device that may be processed on the basis of a graded implantation mask for obtaining an asymmetric well dopant concentration at least in specific areas of the active semiconductor regions, according to illustrative embodiments.

FIG. 2d schematically illustrates the semiconductor device 250 in which the material layer 221 is patterned into an implantation mask, which may also be referred to as implantation mask 221, having a portion 221B in which the ion blocking capability may laterally vary to provide a reduced ion blocking capability above the area 251S compared to the area 251D of the transistor 200B. Moreover, in the embodiment shown, the implantation mask 221 may comprise corresponding portions 221A, 221C having a substantially constant ion blocking capability across the respective portions of the active region 202A corresponding to the transistors 200A, 200C. That is, the ion blocking capability of the mask portions 221A, 221C above transistor internal areas 251S, 251D of the transistors 200A, 200C may be substantially equal so that a substantially symmetric dopant concentration may be accomplished in these transistor elements in a subsequent implantation process for introducing a well dopant species into the active region 202A on the basis of the implantation mask 221. It should be appreciated that the configuration of the implantation mask 221 may be selected differently, as long as an asymmetric configuration with respect to the areas 251S, 251D of the transistor 200B may be obtained. For instance, a more "step-like" difference in thickness between the areas 251S, 251D may be generated during the preceding exposure 222 and the subsequent post-exposure treatment and development instead of a substantially gradual thickness variation as illustrated in FIG. 2d. For example, in some illustrative embodiments (not shown), a corresponding lithography pattern may be used in which at least the area 251D of the transistor 200B may remain substantially unexposed, while the area 251S may receive a moderately high exposure dose which may not significantly vary across the area 251S, thereby finally obtaining a substantially step-like configuration. Thus, also in this case, a difference in thickness and thus ion blocking capability of the mask portion 221B with respect to the areas 251S, 251D may be obtained.

Figure 2E:
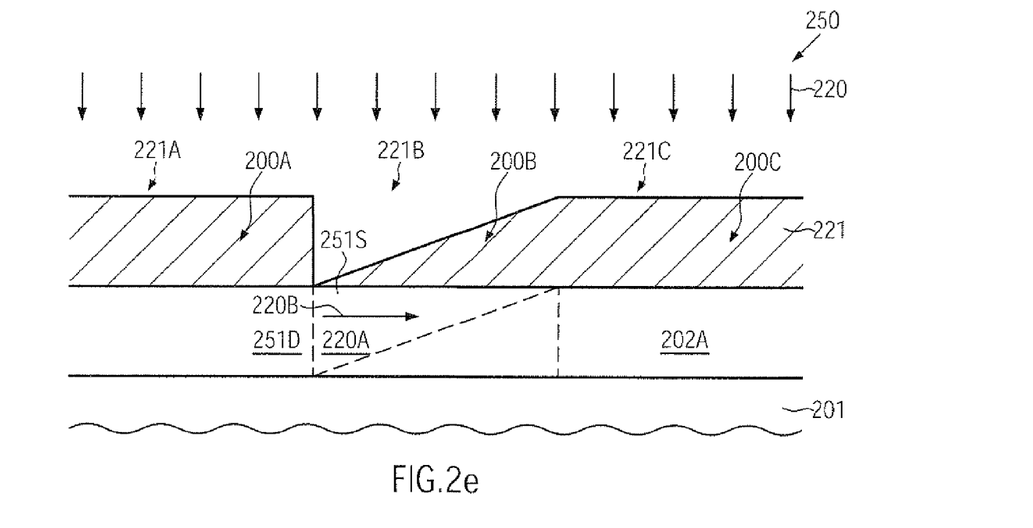

FIG. 2e schematically illustrates the semiconductor device 250 when subjected to an ion implantation process 220 in which an appropriate well dopant species, such as a P-type species for N-channel transistors or an N-type species for P-channel transistors may be introduced in a portion of the active region 202A on the basis of the implantation mask 221. For instance, the ion blocking capability of the mask portions 221A, 221C may be selected so as to substantially suppress significant penetration of implantation species into the underlying portions of the region 202A so that a corresponding desired basic well doping for the transistors 200A, 200C may be established on the basis of an additional implantation process, such as the implantation process 215 previously explained with reference to FIG. 2a. In other cases, a corresponding additional well implantation process may be performed after the process 220 and after the removal of the implantation mask 221. In other cases, a certain degree of dopant penetration may be acceptable if this is compatible with the overall configuration of the transistors 200A, 200B and 200C. On the other hand, the mask portion 221B having the varying thickness and thus ion blocking capability may result in a corresponding varying penetration of the well dopant species, thereby providing a well dopant concentration profile 220A in which penetration depth and the overall amount of dopant species incorporated during the process 220 may decrease from the area 251S toward the area 251D, as indicated by the arrow 220B. Consequently, the overall amount of dopant species 220A contained in the portion of the active region 202A corresponding to the transistor 200B per unit length, i.e., along the horizontal direction in FIG. 2e, may decrease starting from area 251S with a moderately high concentration towards the area 251D. Consequently, upon forming source and drain regions in the areas 251S, 251D, the increased degree of counter doping in the area 251S may provide an increased field strength at the vicinity of corresponding PN junctions to be formed on the basis of the drain and source dopant and the well dopant species 220A so that a desired asymmetric transistor configuration may be obtained, which may thus provide enhanced transistor performance, as previously explained.

Figure 2F:
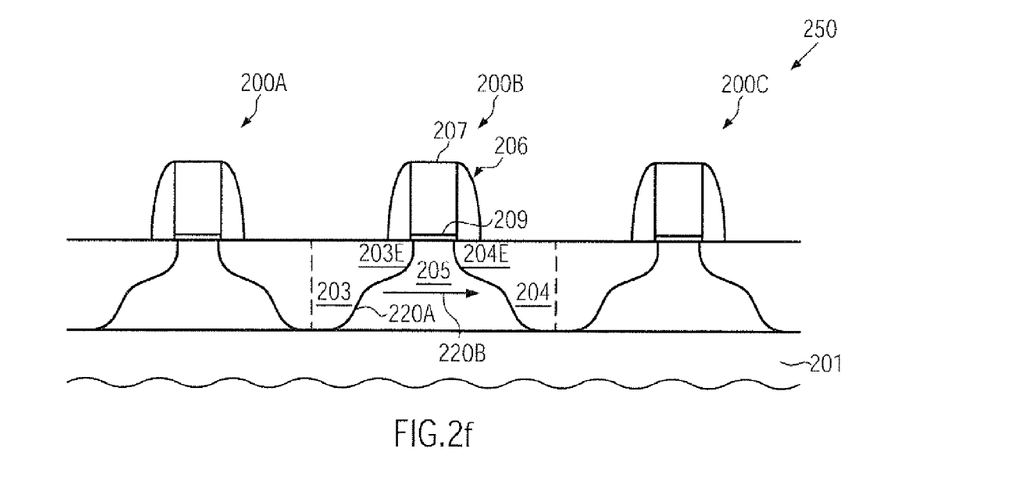
FIG. 2f schematically illustrates a cross-sectional view of the semiconductor device in a further advanced manufacturing stage in which an asymmetric transistor and symmetric transistors may be formed in and above the common active semiconductor region, according to illustrative embodiments.

FIG. 2f schematically illustrates the semiconductor device 250 in a further advanced manufacturing stage. As illustrated, the transistors 200A, 200B and 200C may each comprise a gate electrode 207 formed on a corresponding gate insulation layer 209 which separates the gate electrode 207 from a channel region 205. The channel region 205 in turn laterally separates a source region 203 from a drain region 204, wherein the source and drain regions 203, 204 may comprise a source and drain extension region 203E, 204E, respectively. With respect to the various components of the transistors 200A, 200B and 200C, the same criteria may apply as previously explained with reference to the transistor 100 and the transistors 100A, 100B and 100C as explained in context with FIGS. 1a and 1c. That is, well-established manufacturing techniques and materials may be used for the gate electrode 207 and the gate insulation layer 209, as previously explained. Furthermore, the drain and source regions 204, 203 may be formed on the basis of an appropriate spacer structure 206, which may comprise one or more individual spacer elements, depending on the desired complexity of the lateral and vertical profile of the drain and source regions 204, 203. Furthermore, with respect to a gate length and a distance between adjacent gate electrodes 207, the same criteria may apply as previously explained with reference to the distance d and the gate length 107A, previously referred to in FIGS. 1a and 1c. Consequently, the symmetric transistors 200A, 200C may be positioned in close proximity to the asymmetric transistor 200B in which a desired performance gain may be accomplished on the basis of the varying well dopant concentration 220A, which may decrease in the direction 220B, as also previously explained. That is, a significant portion of the source region 203 and the source extension region 203E may be formed on the basis of an increased degree of counter doping compared to the drain region 204 and the extension region 204E, thereby obtaining the asymmetric field strength distribution for the transistor 200B. The degree of asymmetry of the field strength may, however, contrary to conventional strategies based on tilted halo implantations, as previously explained, be adjusted on the basis of a non-critical substantially non-tilted implantation process in combination with the appropriately designed implantation mask 221 (FIG. 2e), the characteristics of which may be provided substantially without being affected by the actual gate height and gate pitch. That is, a delicate adjustment of resist mask height for a given gate height and gate pitch in combination with an appropriate tilt angle, which may typically have to be reduced with decreasing critical dimensions, may be avoided. In this respect, merely the overall extension of the transistor 200B along the length direction may have to be taken into consideration when appropriately adapting the implantation mask 221 (FIG. 2e) while, in particular, the implantation parameters may be non-critical and may thus be readily selected to obtain the desired degree of asymmetry of the well dopant concentration 220A.

Figure 2G:
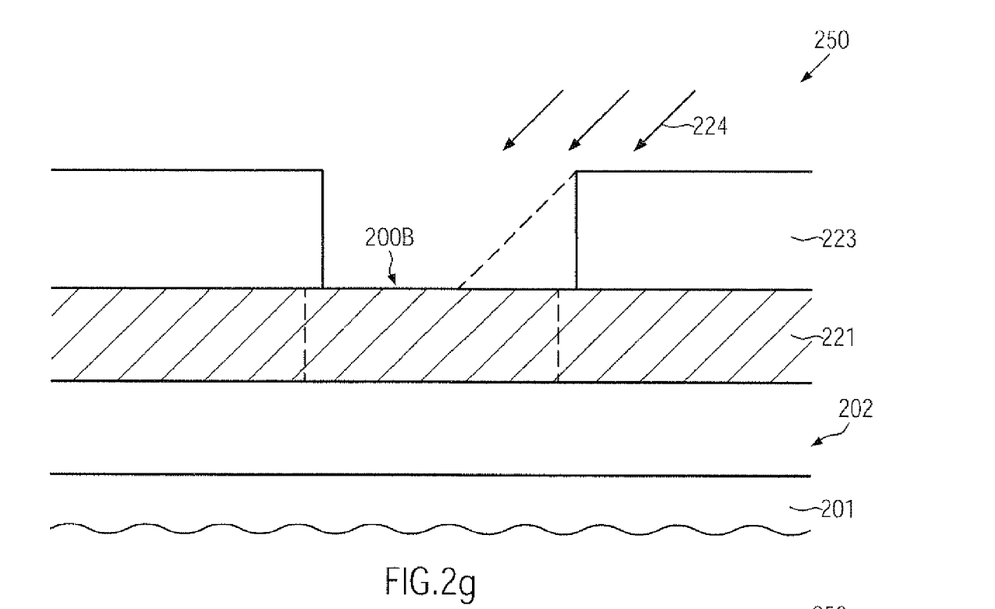
FIGS. 2g-2i schematically illustrate cross-sectional views of the semiconductor device according to still further illustrative embodiments in which an implantation mask having a graded thickness profile may be formed as a non-resist material.
Figure 2H:
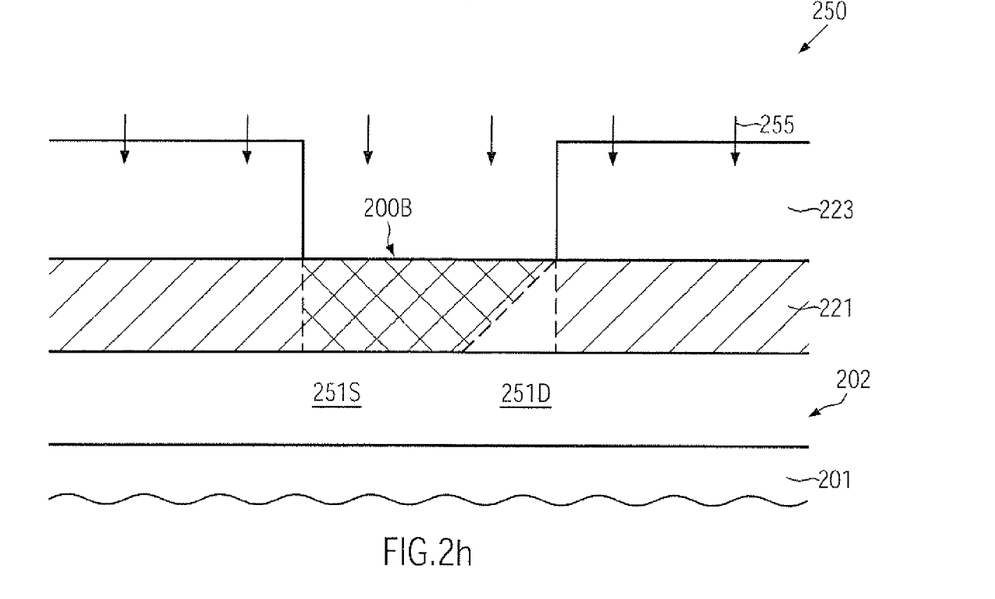
Figure 2I:
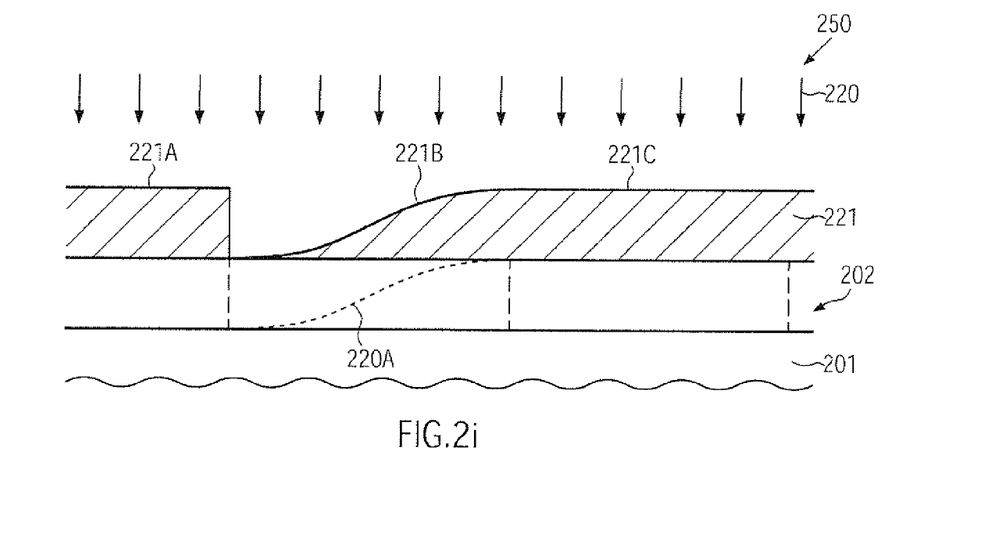

With reference to FIGS. 2g-2i, further illustrative embodiments will now be described in which an implantation mask comprised of non-resist material may be patterned on the basis of a less critical photolithography process to provide the desired asymmetric ion blocking capability.

FIG. 2g schematically illustrates the semiconductor device 250 with the mask material 221 formed above the semiconductor layer 202. The mask material 221 may be comprised of any appropriate material, such as silicon dioxide, silicon nitride and the like, which may thus represent well-established non-resist materials having an increased density and thus ion blocking capability compared to a resist material. Furthermore, in the manufacturing stage shown, an etch mask 223, such as a resist mask, may be formed above the mask material 221, thereby exposing a portion thereof that may substantially correspond to the transistor 200B still to be formed in the layer 202. The mask material 221 may be formed on the basis of any appropriate deposition technique, such as CVD and the like, based on well-established process recipes. In some illustrative embodiments, the mask material 221 may comprise an etch stop layer (not shown) which may provide superior etch stop capabilities in a subsequent process sequence for removing a portion of the mask material 221. For instance, silicon dioxide may be used as an efficient etch stop material in combination with silicon nitride material, while, in other cases, silicon nitride may act as an etch stop material and silicon dioxide may be used as the bulk material for the layer 221. It should be appreciated, however, that any other appropriate material may be used, such as polymer material and the like, as long as an etch behavior of the material 221 may be efficiently modified. For this purpose, the etch mask 223 may be formed, for instance on the basis of a photolithography process, which may be performed without sophisticated lithography techniques for obtaining a graded or different degree of exposure within the exposed portion of the material 221, as previously explained. Furthermore, a thickness of the etch mask 223 may be selected so as to obtain a desired asymmetric patterning of an etch behavior of the exposed portion of the layer 221 on the basis of a tilted implantation process 224, during which an appropriate species, such as xenon, germanium, silicon and the like, may be introduced into the material 221, thereby significantly modifying the overall etch behavior. It should be appreciated that, although the implantation process 224 may be performed on the basis of a tilt angle, increased flexibility in selecting an appropriate thickness of the mask 223 and the tilt angle 224 may be accomplished compared to conventional strategies for forming asymmetric transistor configurations, as previously explained with reference to FIGS. 1a-1c, since, for example, a penetration of the implantation species into covered portions of the material 221 may be less critical since the mask 223 may be maintained during a subsequent etch process so that a corresponding modification of the etch behavior of covered portions of the material 221 may not unduly affect the patterning of the exposed portion of the layer 221. Furthermore, implantation energy of the process 224 may be selected in any appropriate manner so as to avoid undue dopant penetration of the semiconductor layer 202, if considered inappropriate. Thus, even if the implantation species may be reliably stopped within the material 221, a corresponding efficient modification of etch behavior of the upper portion of the material layer 221 may result in a corresponding difference in advance of the etch front, which may finally result in an appropriately designed implantation mask.

FIG. 2h schematically illustrates the semiconductor device 250 when exposed to an etch ambient 225 designed to remove material of the layer 221 selectively to the semiconductor layer 202 or to a corresponding etch stop layer (not shown). Due to the previously introduced implantation species, the removal rate during the process 225 may be higher in areas having received an increased dose of implantation species so that the corresponding etch front may advance faster above the area 251S compared to the area 251D.

FIG. 2i schematically illustrates the device 250 in a further advanced manufacturing stage, i.e., after completing the etch process 225 and removing the etch mask 223 (FIG. 2h). Consequently, the material 221 may now be patterned so as to represent an implantation mask having the portion 221B with a varying ion blocking capability, as previously explained. On the other hand, the portions 221A, 221C may provide a desired high ion blocking capability, as previously explained. Thus, upon performing the ion implantation process 220, the well dopant concentration 220A may be achieved with the desired degree of asymmetry on the basis of the mask portion 221B. Thereafter, the material 221 may be removed, for instance on the basis of well-established selective etch recipes, wherein the corresponding removal process may be controlled on the basis of an etch stop layer (not shown), which may then be removed by applying well-established recipes. For instance, silicon nitride may be efficiently removed selectively to silicon dioxide, which in turn may be removed selectively to a silicon material on the basis of well-established techniques. Thereafter, the further processing may be continued as previously described. Consequently, the mask portion 221B may be accomplished on the basis of less critical lithography conditions, while nevertheless providing enhanced design and process flexibility compared to conventional strategies.

Figure 2J:
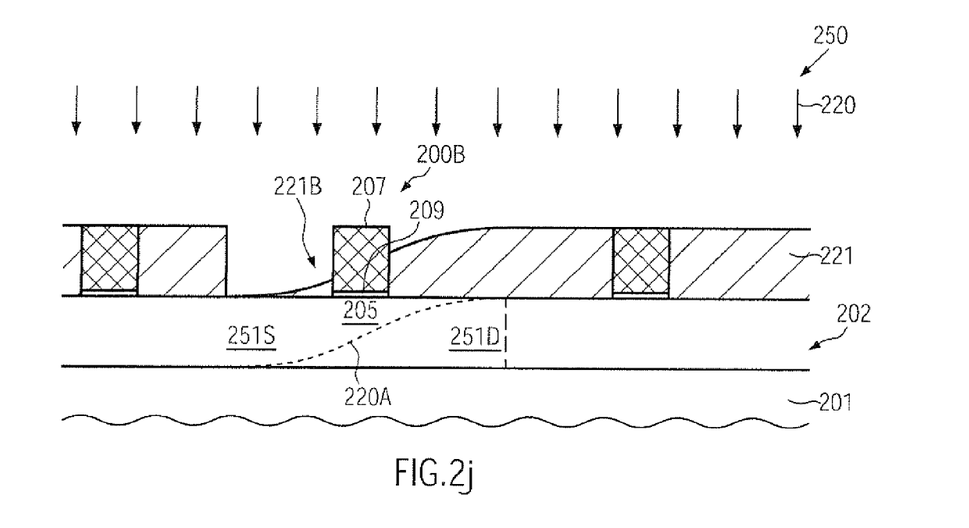
FIG. 2j schematically illustrates the semiconductor device according to illustrative embodiments in which a graded implantation mask may be provided in an advanced manufacturing stage, i.e., after forming corresponding gate electrode structures.

FIG. 2j schematically illustrates the semiconductor device 250 according to further illustrative embodiments in which the asymmetric configuration of the well doping may be accomplished in a later manufacturing stage, i.e., after forming gate electrodes. That is, the gate electrodes 207 in combination with the gate insulation layers 209 may be formed on the basis of conventional manufacturing strategies. Thereafter, the mask material 221 may be provided, for instance in the form of a resist material, a polymer material or any other appropriate mask material, such as well-established dielectric materials and the like. The material 221 may be deposited by spin-on techniques and the like wherein, if required, a planarity of the material 221 may be enhanced by performing an additional planarization process, such as a chemical mechanical polishing (CMP) process and the like. Thereafter, the material 221 may be patterned so as to obtain the portion 221B having the desired asymmetry with respect to ion blocking capability, as previously explained. For this purpose, in some illustrative embodiments, sophisticated exposure techniques may be used, as for instance explained with reference to the exposure process 222 (FIG. 2c), when the material 221 is provided in the form of a radiation sensitive resist material. In other illustrative embodiments, an additional etch mask may be provided in combination with an appropriate treatment for locally modifying the etch behavior, as is for instance explained with reference to FIGS. 2g and 2h. Hence, also in this case, the graded portion 221B may be obtained and may subsequently be used for incorporating a well dopant species in an asymmetric manner. Hence, during the implantation process 220, the dopant concentration 220A may be obtained as a graded profile in the areas 251S, 251D, while the channel region 205 may exhibit the well doping concentration along a length direction of the transistor 200B due to the ion blocking effect of the gate electrode 207. After the implantation process 220, the material 221 may be removed, for instance by any appropriate etch process, wherein an etch stop material may also be used (not shown) in order to reduce damage at exposed portions of the layer 202 and the gate electrodes 207. Thereafter, the further processing may be continued by forming the source and drain regions in the areas 251S, 251D, as previously explained.

As a result, the present disclosure provides semiconductor devices and techniques in which an asymmetric configuration of transistors may be accomplished with enhanced design and process flexibility compared to conventional strategies. That is, the well dopant concentration may be provided in an asymmetric manner with respect to the drain and source areas of asymmetric transistors by using a substantially non-tilted implantation process and using a specifically designed implantation mask having an asymmetric ion blocking capability. Consequently, the asymmetric configuration may be established substantially without being affected by device dimensions, such as gate height, gate pitch and the like, thereby providing scalability of the asymmetric configuration of transistors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming an implantation mask above a semiconductor region, said implantation mask having a first ion blocking capability above a first transistor internal area of a transistor and having a second ion blocking capability above a second transistor internal area of said transistor, said first and second ion blocking capabilities differing from each other, wherein the first transistor internal area is used for forming a source region and wherein the second transistor internal area is used for forming a drain region;

implanting a well dopant species into said first and second transistor internal areas on the basis of said implantation mask; and forming a gate electrode above a channel area of said semiconductor region, said channel area laterally separating said first and second transistor internal areas.

2. The method of claim 1, wherein forming said implantation mask comprises forming an ion blocking material with a varying thickness above said first and second transistor internal areas.

3. The method of claim 2, wherein said ion blocking material comprises a resist material.

4. The method of claim 2, wherein said ion blocking material comprises a non-resist material.

5. The method of claim 4, wherein forming said ion blocking material comprises depositing said non-resist material, locally varying an etch behavior of said non-resist material and removing material of said non-resist material on the basis of said locally varying etch behavior.

6. A method comprising:

forming an implantation mask above a semiconductor region, said implantation mask having a first ion blocking capability above a first transistor internal area of a transistor and having a second ion blocking capability above a second transistor internal are of said transistor, said first and second ion blocking capabilities differing from each other, wherein forming said implantation mask comprises forming an ion blocking material with a varying thickness above said first and second transistor internal areas, wherein said ion blocking material comprises a non-resist material, wherein forming said ion blocking material comprises depositing said non-resist material, locally varying an etch behavior of said non-resist material and removing material of said non-resist material on the basis of said locally varying etch behavior, and wherein locally varying said etch behavior comprises forming a resist mask above said non-resist material and performing an implantation process using a tilt angle so as to introduce an implantation species locally varying said etch behavior;

implanting a well dopant species into said first and second transistor internal areas on the basis of said implantation mask; and forming a gate electrode above a channel area of said semiconductor region, said channel area laterally separating said first and second transistor internal areas.

7. The method of claim 1, further comprising forming an isolation structure prior to forming said implantation mask, wherein said isolation structure laterally delineates said semiconductor region.

8. The method of claim 1, further comprising forming an isolation structure after forming said implantation mask, wherein said isolation structure laterally delineates said semiconductor region.

9. The method of claim 1, wherein said first ion blocking capability is less than said second ion blocking capability.

10. The method of claim 1, wherein said implantation mask covers a first transistor internal area and a second transistor internal area of a second transistor and wherein an ion blocking capability of said implantation mask above said first transistor internal area of said second transistor is substantially equal to an ion blocking capability of said implantation mask above said second transistor internal area of said second transistor, wherein the first transistor internal area of the second transistor is used for forming a source region and wherein the second transistor internal area of the second transistor is used for forming a drain region.

11. The method of claim 10, wherein said first and second transistor internal areas of said transistors and said first and second transistor internal areas of said second transistor are formed in said semiconductor region without providing an intermediate isolation structure between said transistor and said second transistor.

12. The method of claim 1, further comprising implanting an additional portion said well dopant species into said first and second transistor internal areas without using said implantation mask.

13. The method of claim 1, wherein said gate electrode is formed to have a length of approximately 50 nm or less.

14. The method of claim 1, wherein implanting the well dopant species into said first and second transistor internal areas on the basis of said implantation mask comprises implanting the well dopant species into said first and second transistor internal areas so that the overall amount of dopant species decreases from the first transistor internal area to the second transistor internal area.

15. A method, comprising:

forming a graded implantation mask above a first transistor internal area and a second transistor internal area of a transistor, said graded implantation mask providing a first ion blocking capability for said first transistor internal area and a second increased ion blocking capability for said second transistor internal area, wherein said second ion blocking capability is greater than said first ion blocking capability, wherein the first transistor internal area is used for forming a source region and wherein the second transistor internal area is used for forming a drain region;

forming a gate electrode after forming said graded implantation mask;

introducing a well dopant species in said first and second transistor internal areas on the basis of said implantation mask; and forming a drain and source regions on the basis of said first and second transistor internal areas so as to obtain an asymmetric transistor configuration.

* * * * *